US008432043B2

(12) United States Patent
Takiar et al.

(10) Patent No.: US 8,432,043 B2
(45) Date of Patent: Apr. 30, 2013

(54) STACKED WIRE BONDED SEMICONDUCTOR PACKAGE WITH LOW PROFILE BOND LINE

(75) Inventors: Hem Takiar, Fremont, CA (US); Shrikar Bhagath, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 525 days.

(21) Appl. No.: 12/165,362

(22) Filed: Jun. 30, 2008

(65) Prior Publication Data

US 2009/0321951 A1 Dec. 31, 2009

(51) Int. Cl.
*H01L 23/52* (2006.01)

(52) U.S. Cl.
USPC 257/777; 257/784; 257/E23.02; 257/E23.024

(58) Field of Classification Search ............ 257/777, 257/778, 784, 786, E23.019, E23.02, E23.024
See application file for complete search history.

(56) References Cited

U.S. PATENT DOCUMENTS

| | | | |
|---|---|---|---|
| 3,623,649 A | 11/1971 | Keisling | |
| 5,111,989 A | 5/1992 | Holdgrafer et al. | |
| 5,328,079 A * | 7/1994 | Mathew et al. | 228/180.5 |
| 5,734,200 A | 3/1998 | Hsue et al. | |
| 7,145,248 B2 | 12/2006 | Aksyuk et al. | |
| 7,232,747 B2 | 6/2007 | Farnworth et al. | |
| 7,282,431 B2 | 10/2007 | Kang et al. | |
| 7,326,594 B2 | 2/2008 | Beauchamp et al. | |
| 7,393,772 B2 | 7/2008 | Gleixner et al. | |
| 7,459,385 B1 | 12/2008 | Lin et al. | |
| 7,629,689 B2 | 12/2009 | Maeda | |
| 7,675,180 B1 | 3/2010 | St. Amand et al. | |
| 7,855,103 B2 | 12/2010 | Gleixner et al. | |
| 2001/0033020 A1 | 10/2001 | Stierman et al. | |
| 2007/0065987 A1 | 3/2007 | Mess et al. | |
| 2007/0167000 A1 * | 7/2007 | Wood et al. | 438/629 |
| 2008/0237829 A1 * | 10/2008 | Cheah et al. | 257/690 |
| 2010/0230809 A1 | 9/2010 | Calpito et al. | |

OTHER PUBLICATIONS

Reid et al., "Providing Stacked Die Solutions with Wedge Bonding Technology", SEMICON Singapore 2002.
Babinetz, "Wire Bonding Solutions for 3-D Stacked Die Packages", Electronics Manufacturing Engineering: Q3/2003.
Brunner et al., "Advanced Wire Bond Looping Technology for Emerging Packages", 2004 IEEE/Semi Int'l Electronics Manufacturing Technology Symposium.
Kossner et al., "Assembly Solutions for 3-D Stacked Devices", SEMICON Singapore 2002.
Office Action dated Feb. 22, 2011, U.S. Appl. No. 12/165,340.

(Continued)

*Primary Examiner* — Matthew E Warren
(74) *Attorney, Agent, or Firm* — Vierra Magen Marcus LLP

(57) ABSTRACT

A low profile semiconductor package is disclosed including at least first and second stacked semiconductor die mounted to a substrate. The first and/or second semiconductor die may be fabricated with a plurality of redistribution pads formed over and electrically coupled to a plurality of bond pads. After the semiconductor die are formed and diced from the wafer, the die may be mounted to the substrate using a low profile reverse wire bond according to the present invention. In particular, a wedge bond may be formed between the wire and the redistribution pad without having to use a second wire bond ball on the die bond pad as in conventional reverse ball bonding processes.

18 Claims, 9 Drawing Sheets

OTHER PUBLICATIONS

Response to Office Action filed Jun. 22, 2011, U.S. Appl. No. 12/165,340.
Final Office Action mailed Oct. 31, 2011, U.S. Appl. No. 12/165,340.
Response to Final Office Action filed Jan. 31, 2012 in U.S. Appl. No. 12/165,340.
Supplemental Amendment filed Mar. 6, 2012 in U.S. Appl. No. 12/165,340.
Notice of Allowance and Fee(s) Due dated Mar. 19, 2012 in U.S. Appl. No. 12/165,340.

* cited by examiner

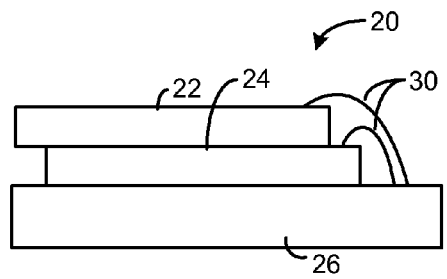
Fig. 1
(Prior Art)
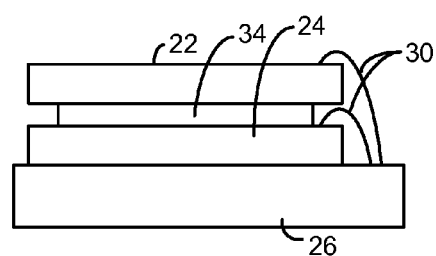
Fig. 2
(Prior Art)
Fig. 3
(Prior Art)
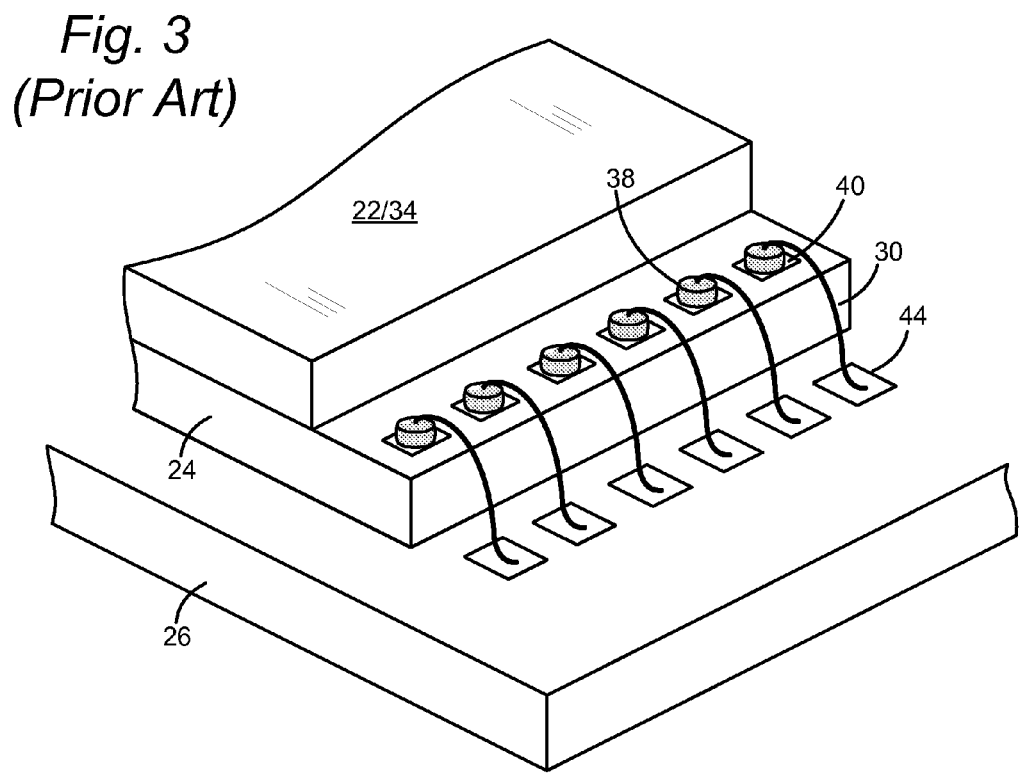

*Fig. 6*
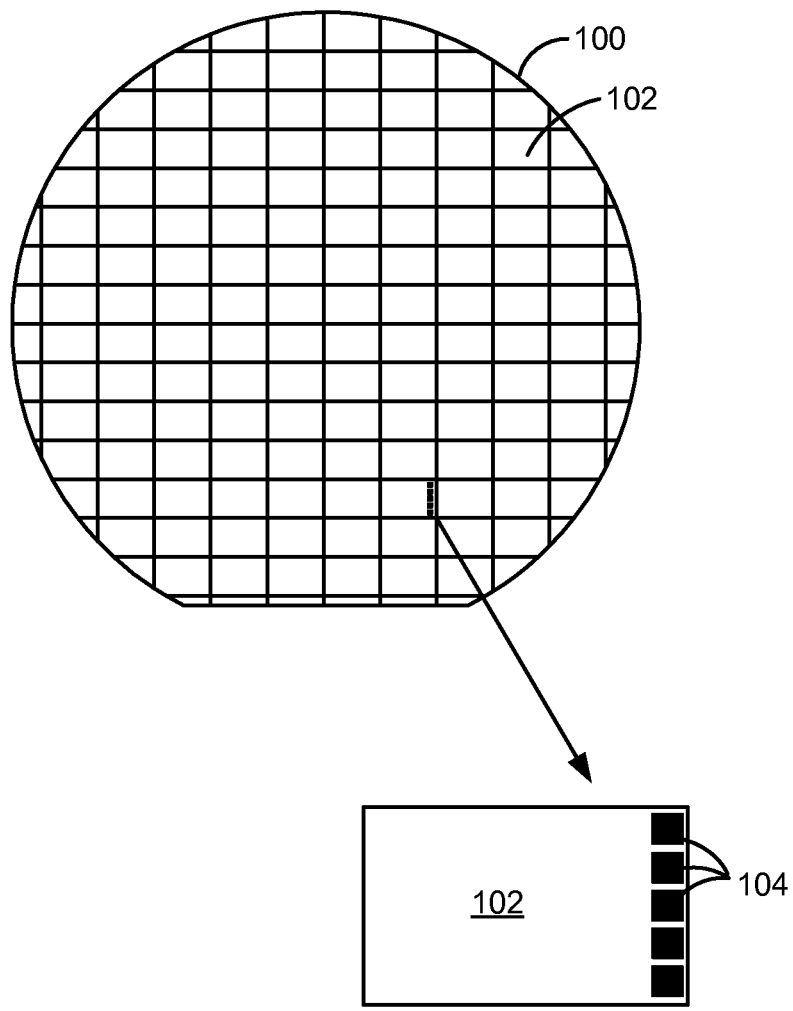
*Fig. 7*
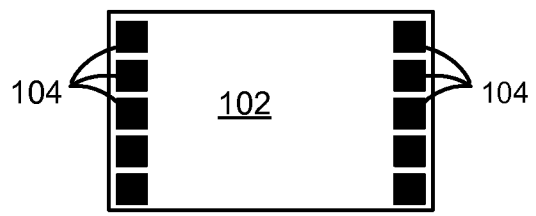
*Fig. 8*

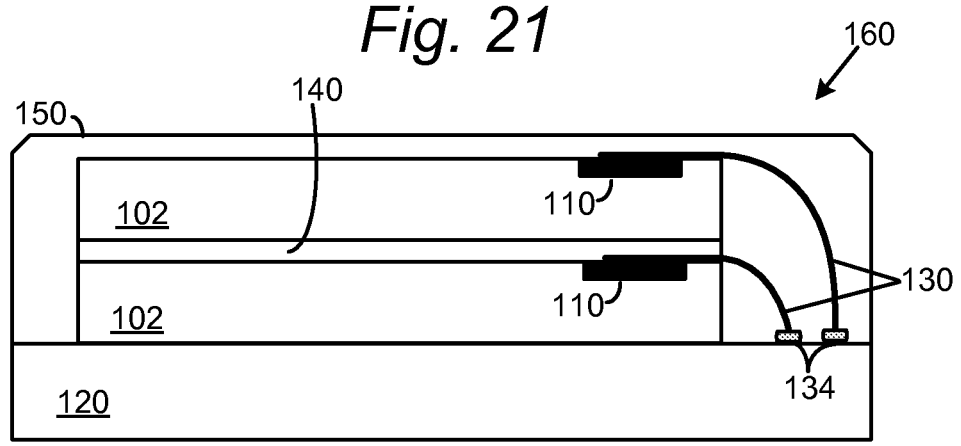

STACKED WIRE BONDED SEMICONDUCTOR PACKAGE WITH LOW PROFILE BOND LINE

CROSS-REFERENCE TO RELATED APPLICATION

The following application is cross-referenced and incorporated by reference herein in its entirety:

U.S. patent application Ser. No. 12/165,340, entitled "Method of Fabricating Stacked Wire Bonded Semiconductor Package with Low Profile Bond Line," by Takiar, et al., filed on even date herewith.

BACKGROUND OF THE INVENTION

1. Field of the Invention

Embodiments of the present invention relate to a low profile semiconductor device and method of fabricating same.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound to provide a protective package.

An edge view of a conventional semiconductor package 20 (without molding compound) is shown in prior art FIGS. 1 and 2. Typical packages include a plurality of semiconductor die 22, 24 mounted to a substrate 26. Although not shown in FIGS. 1 and 2, the semiconductor die are formed with die bond pads (40 in FIGS. 3 and 4). Substrate 26 may be formed of an electrically insulating core sandwiched between upper and lower conductive layers. The upper and/or lower conductive layers may be etched to form a conductance patterns including electrical leads and contact pads (52, FIGS. 3 and 4). Wire bonds are soldered to the die bond pads 40 of the semiconductor die 22, 24 and contact pads 52 of the substrate 26 as explained hereinafter to electrically couple the semiconductor die to the substrate.

It is known to layer semiconductor die on top of each other either with an offset (prior art FIG. 1) or in a stacked configuration (prior art FIG. 2). In the offset configuration of FIG. 1, the die are stacked with an offset so that the bond pads of the next lower die are left exposed. Such configurations are shown for example in U.S. Pat. No. 6,359,340 to Lin, et al., entitled, "Multichip Module Having A Stacked Chip Arrangement." An offset configuration provides an advantage of convenient access of the bond pads on each of the semiconductor die. However, the offset requires a greater footprint on the substrate, where space is at a premium.

In the stacked configuration of FIG. 2, two or more semiconductor die are stacked directly on top of each other, thereby taking up less footprint on the substrate as compared to an offset configuration. However, in a stacked configuration, space must be provided between adjacent semiconductor die for the bond wires 30. In addition to the height of the bond wires 30 themselves, additional space must be left above the bond wires, as contact of the bond wires 30 of one die with the next die above may result in an electrical short. As shown in FIG. 2, it is therefore known to provide a dielectric spacer layer 34 to provide enough room for the wire bond 30 to be bonded to the die bond pad on the lower die 24. Instead of a spacer layer 34, it is also known to bury the wire bond loops between two adjacent semiconductor die within an adhesive layer between the respective die. Such configurations are shown for example in U.S. Pat. No. 6,388,313 to Lee et al., entitled, "Multi-Chip Module," and U.S. Pat. No. 7,037,756 to Jiang et al., entitled, "Stacked Microelectronic Devices and Methods of Fabricating Same."

There is an ever-present drive to increase storage capacity within memory modules. One method of increasing storage capacity is to increase the number of memory die used within the package. In portable memory packages, the number of die which may be used is limited by the thickness of the package. There is accordingly a keen interest in decreasing the thickness of the contents of a package while increasing memory density.

The package 20 shown in prior art FIGS. 1 and 2 requires that additional space be provided within the package to accommodate the height of the wire bond loops. Further details relating to conventional processes for forming wire bond loops 30 are explained with reference to the perspective views of prior art FIGS. 3 and 4. FIGS. 3 and 4 show lower semiconductor die 24 wire bonded to substrate 26 via bond wires 30. The structure affixed atop semiconductor die 24 can be another semiconductor die, such as die 22 of FIG. 1, or the structure can be a spacer layer, such as layer 34 of FIG. 2.

FIG. 3 shows bond wires 30 formed by a ball bonding process. This process uses a wire bonding device referred to as a wire bonding capillary. A length of wire (typically gold or copper) is fed through a central cavity of the wire bonding capillary. The wire protrudes through a tip of the capillary, where a high-voltage electric charge is applied to the wire from a transducer associated with the capillary tip. The electric charge melts the wire at the tip and the wire forms into a ball (38 in FIG. 3) owing to the surface tension of the molten metal.

As the ball solidifies, the capillary is lowered to the surface of a die bond pad 40 formed on the surface of semiconductor die 24. The surface of die 24 may be heated to facilitate a better bond. The wire bond ball 38 is deposited on the die bond pad 40 under a load, while the transducer applies ultrasonic energy. The combined heat, pressure, and ultrasonic energy create a bond between the wire bond ball 38 and the die bond pad 40.

The wire bonding capillary is then pulled up and away from the surface of semiconductor die 24, as wire is payed out through the capillary. The capillary then moves over to a contact pad 44 receiving the second end of the wire bond on the substrate 26. The second bond, referred to as a wedge or tail bond, is then formed on contact pad 44 again using heat, pressure and ultrasonic energy, but instead of forming a ball, the wire is crushed under pressure to make the second bond. The wire bonding device then pays out a small length of wire and tears the wire from the surface of the second bond. The small tail of wire hanging from the end of the capillary is then used to form the wire bond ball 38 for the next subsequent wire bond. The above-described cycle can be repeated about 20 to 30 times per second until all wire bond loops 30 are formed between the semiconductor die and the substrate. It is understood that there may be many more wire bond loops 30 than are shown in FIGS. 3 and 4.

Due to the fact that the wire 30 must be pulled upwards from ball 38 on each wire bond loop 30, the wire bonds shown in FIG. 3 formed by the ball bonding process have a relatively large height. As indicated above, this height adds to the overall thickness of the package where space is at a premium. Prior art FIG. 4 is a perspective view of die 24, substrate 26 and wire bonds 30 formed by a reverse ball bonding process. In a reverse ball bonding process, a ball 50 is initially formed on the die bond pads 40 of semiconductor die 24. Namely, the capillary forms the ball and bonds it to the bond pad 40, but pulls away without paying out wire. Thereafter, to form a first wire bond loop, a second ball 52 is formed on a contact pad 44 of the substrate, and the capillary pulls up and away from the ball 52 while paying out wire. The capillary then bonds the wire 30 to the corresponding ball 50 on the die bond pad 40 using a wedge bond. As the capillary attaches the wire 30 to the ball 50 using a flat wedge bond, the wire bond has a lower profile than in the forward ball bonding process of FIG. 3, where the wire was lifted up and away from the ball 38 on the die bond pads.

Conventionally, the ball 50 is required on die bond pads 40 in the reverse ball bonding process of FIG. 4 for at least two reasons. First, unlike the substrate contact pads 44, the die bond pads 40 are too small to receive a wedge bond. Second, the die bond pads are recessed slightly below the upper surface of the semiconductor die, further preventing the capillary from forming a wedge bond directly to the die bond pads. This problem is solved in the prior art by first affixing the balls 50 to the die bond pads 40 of die 22 and then wedge bonding to the balls 50 in a reverse ball bonding process.

SUMMARY OF THE INVENTION

An embodiment of the present invention relates to a low profile semiconductor package including at least first and second stacked semiconductor die mounted to a substrate. The first and/or second semiconductor die may be fabricated with a plurality of redistribution pads formed over and electrically coupled to a plurality of bond pads. The redistribution pads may be formed by redistribution layer (RDL) technology to overlay and increase the size of the semiconductor die bond pads. An electrically insulating passivation layer may cover the upper surface of the die with openings where the redistribution pads are located.

After the semiconductor die are formed and diced from the wafer, the die may be mounted to the substrate using a low profile reverse wire bond according to the present invention. In particular, a capillary device forms a ball at the end of the wire which is bonded to a substrate pad. The capillary pulls up and away from the bonded ball while paying out wire. The capillary then bonds the wire to a designated redistribution pad on die using a low height wedge bond. In accordance with the present invention, the wedge bond may be formed between the wire and the redistribution pad without having to use a second wire bond ball on the die bond pad as in conventional reverse ball bonding processes. Thus, the height required by the additional ball used in conventional reverse ball bonding processes may be saved. Moreover, the passivation layer provides electrical insulation, and allows the bond wire to be pulled taut against the upper surface of the semiconductor die without electrical shorting between the wire and semiconductor die.

Once a first semiconductor die is wire bonded to the substrate, one or more additional semiconductor die may be stacked thereon and wire bonded to the substrate. One or more of the semiconductor die in the die stack may be wire bonded using the low height reverse wire bond process according to the present invention as described above. The die may be stacked in either an offset configuration, or stacked in a completely overlapping configuration. In this latter embodiment, the die may be separated by an intermediate layer, which may be a rigid spacer layer or a curable epoxy adhesive.

DESCRIPTION OF THE DRAWINGS

FIG. 1 is a prior art edge view of a conventional semiconductor device including a pair of semiconductor die stacked in an offset relation.

FIG. 2 is a prior art edge view of a conventional semiconductor device including a pair of semiconductor die stacked in an overlapping relation and separated by a spacer layer.

FIG. 3 is a prior art partial perspective view of a conventional semiconductor device including a semiconductor die mounted and wire bonded to a substrate.

FIG. 6 is a top view of a semiconductor wafer from which a plurality of semiconductor die according to embodiments of the present invention may be fabricated.

FIG. 7 is a top view of a semiconductor die during fabrication.

FIG. 8 is a top view of an alternative semiconductor die during fabrication.

FIG. 21 is an edge view of a finished semiconductor device according to an alternative embodiment of the present invention.

DETAILED DESCRIPTION

Embodiments will now be described with reference to FIGS. 5 through 21, which relate to a low profile semiconductor package. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

A process for forming semiconductor die in accordance with the present invention will now be described with reference to the flowchart of FIG. 5, and the various top and edge views of FIGS. 6 through 15. FIG. 6 shows a top view of a semiconductor wafer 100 for batch processing a plurality of semiconductor die 102 (one of which is labeled in FIG. 6). Each die 102 may be formed with bond pads 104 as shown for example in the enlarged view of die 102 in FIG. 7. Bond pads 104 are used to electrically couple the semiconductor die 102 to another semiconductor die, or to a printed circuit board, leadframe or other substrate as explained hereinafter. While bond pads 104 are shown along a single edge of die 102 in FIG. 7, it is understood that the bond pads 104 may be formed along two opposed or adjacent edges as shown in FIG. 8. It is also contemplated that the bond pads 104 may be formed along three edges or all four edges of each die 102 in alternative embodiments. It is understood that the number of bond pads 104 along a given edge of the semiconductor die 102 may be many more than is shown in the figures.

Figure 4:
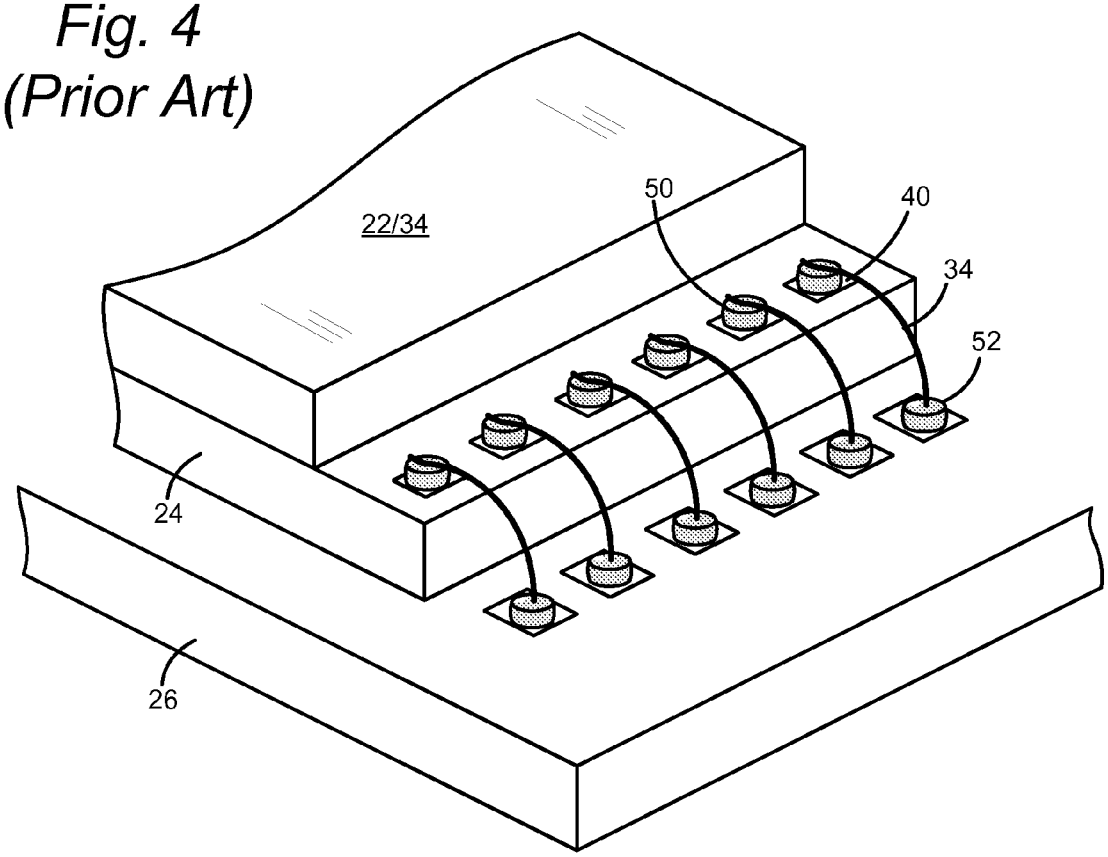
FIG. 4 is a prior art partial perspective view of a conventional semiconductor device including a semiconductor die mounted and wire bonded to a substrate using a reverse ball bonding process.
Figure 5:
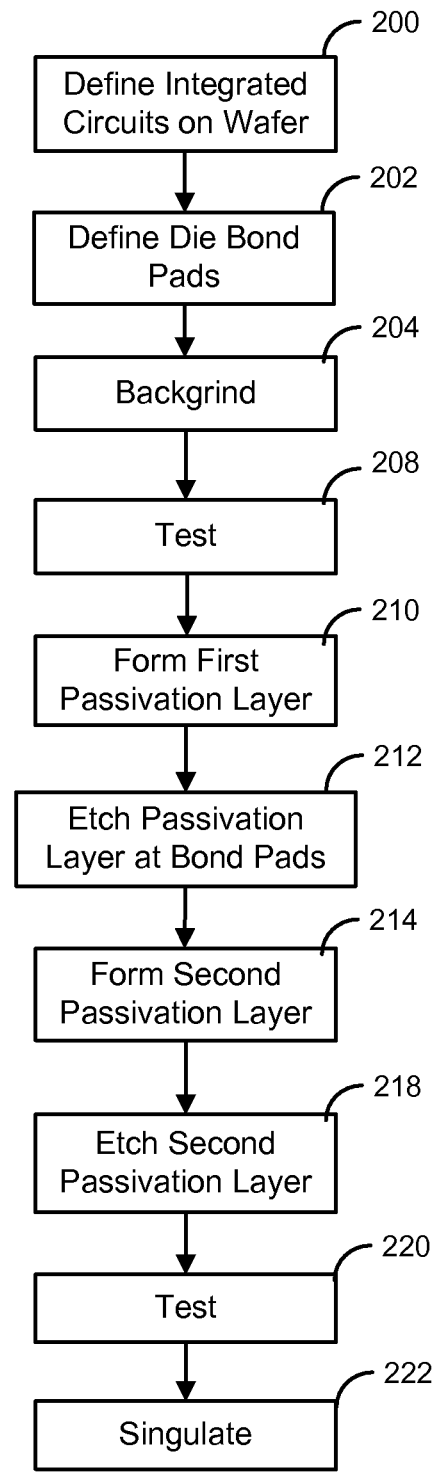
FIG. 5 is a flowchart for forming a semiconductor die according to embodiments of the present invention.
Figure 9:
FIG. 9 is a top view of a semiconductor die during fabrication.

Referring now to the flowchart of FIG. 5, the integrated circuit components of semiconductor die 102 may be formed on wafer 100 in step 200 by known processes such as film deposition, photolithography, patterning, and diffusion of impurities. Die bond pads 104 may be formed in respective die in step 202 by known processes including but not limited to plating, evaporation, screen printing, or various deposition processes. A backgrind process may be performed on wafer 100 in step 204 as is known in the art to thin the die 102 to the desired thickness. The respective semiconductor die may then be tested in step 208.

Figure 10:
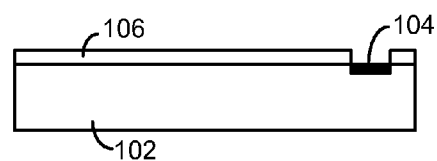
FIG. 10 is an edge view of a semiconductor die during fabrication.

In accordance with the present invention, each of the bond pads 104 is enlarged by forming a redistribution pad over the bond pads 104. The following steps are described with respect to a single die 102, but it is understood that the following steps are applied to each die 102 on wafer 100. In step 210 and as shown in the top and edge views of FIGS. 9 and 10, a passivation layer 106 may be applied to the semiconductor die 102, initially covering the entire surface of the die 102. Passivation layer 106 may be any number of dielectric materials, such as for example photo-definable benzocyclobutane or other known suitable materials, applied in a known process. In a step 212, passivation layer 106 may be etched to expose all existing die bond pads 104 on semiconductor die 102 as best seen in FIG. 10. Passivation layer 106 may be etched using known photolithography and etching techniques to expose die bond pads 104 on semiconductor die 102.

Figure 11:
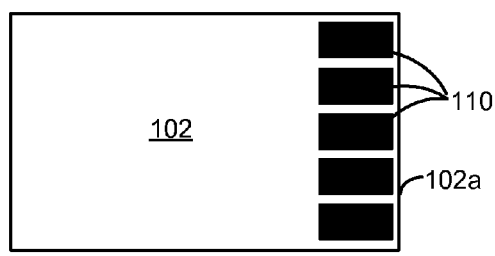
FIG. 11 is a top view of a semiconductor die during fabrication including redistribution pads.
Figure 12:
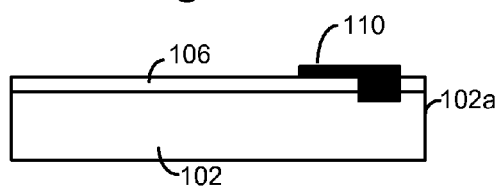
FIG. 12 is an edge view of a semiconductor die during fabrication including redistribution pads.

Referring now to the top and edge views of FIGS. 11 and 12, in step 214, an electrical conductor may be deposited on the die bond pads 104 exposed in the etching process of step 212 to form a redistribution pad 110 on the bond pads 104. The electrical conductor may for example be gold, aluminum, copper, nickel or alloys thereof. In embodiments using for example gold, a barrier metal may be deposed between the bond pads and the gold layer to enhance bonding and conductive properties of the redistribution pad 110. The redistribution pads 110 may be applied on bond pads 104 by known deposition processes, such as for example sputtering.

Figure 13:
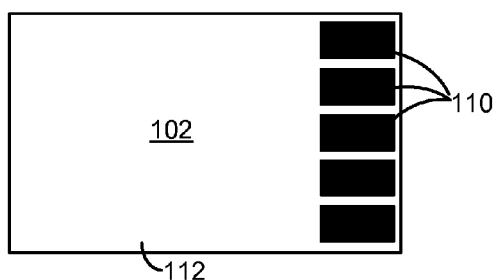
FIG. 13 is a top view of a semiconductor die upon completion of fabrication including redistribution pads.
Figure 14:
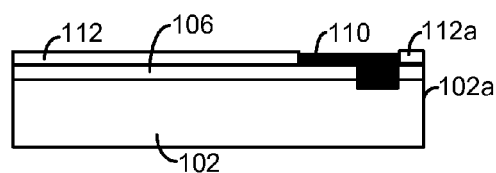
FIG. 14 is an edge view of a semiconductor die upon completion of fabrication including redistribution pads.
Figure 15:
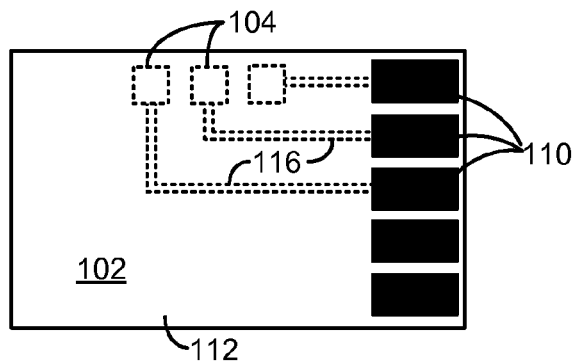
FIG. 15 is a top view of a semiconductor die upon completion of fabrication including redistribution pads according to an alternative embodiment.

Referring now to the top and edge views of FIGS. 13 and 14, in step 214, a second passivation layer 112 may next be applied to the top surface of semiconductor die 102, initially covering all of the redistribution pads 110. Passivation layer 112 may be the same as passivation layer 106 described above. In step 216, passivation layer 112 may be etched to expose the final locations of the redistribution pads 110 on the semiconductor die 102. The second passivation layer 112 may be etched in step 218 using known photolithography and etching techniques.

Bond pads 104 may have a width of approximately 60 to 70 microns (μm), and a length of approximately 60 μm to 70 μm. The final exposed redistribution pads 110 over the bond pads 104 may have a width equal to approximately 60 μm to 100 μm, and more particularly 80 μm to 100 μm (space between bond pads allowing). The final exposed redistribution pads 110 may have a length of 150 μm to 300 μm, and more particularly, 200 μm to 250 μm. It is understood that the length and width of the redistribution pads may be smaller or larger than that in alternative embodiments. The redistribution pads 110 may be spaced the same distance from an edge 102a of the die 102 as are the bond pads 104. However, it is understood that the redistribution pads 110 may be spaced a lesser or greater distance from edge 102a than the bond pads 104. A portion 112a of the second passivation layer 112 exists on a top surface of the semiconductor die 102 at the edge 102a. The portion 112a prevents shorting of a wire bond against the top surface of the semiconductor die as explained hereinafter.

In a step 220, the respective semiconductor die may be tested, and the die 102 may be singulated from wafer 100 in a step 222. It is understood that the type of semiconductor die which may be formed as described above may be any of a variety of semiconductor die, including flash memory die and controller die such as ASICs. The above-described steps are one of many possible processes for forming redistribution pads 110 over bond pads 104.

In the embodiments described above, the redistribution pads 110 are formed directly over their corresponding bond pads 104. However, in an alternative embodiment, it is contemplated that a redistribution pad 110 may be spaced from its corresponding bond pad 104. Such an embodiment is shown for example in FIG. 15. Here, the spaced bond pads 104 may be coupled to their corresponding repositioned redistribution pads 110 by conductive paths 116 formed by conventional RDL techniques when the redistribution pad is formed.

Figure 16:
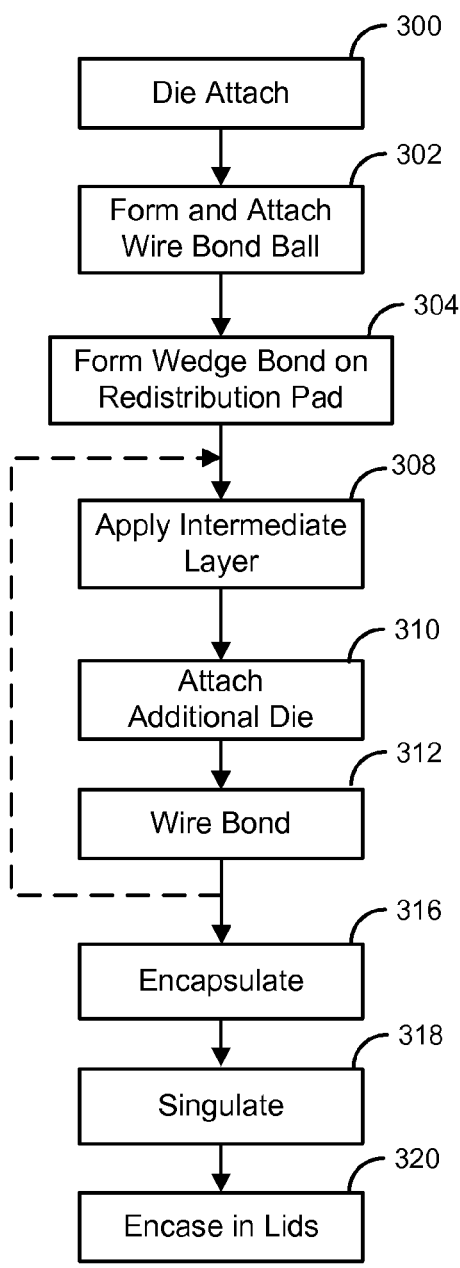
FIG. 16 is a flowchart showing the fabrication of a semiconductor device according to the present invention.
Figure 17:
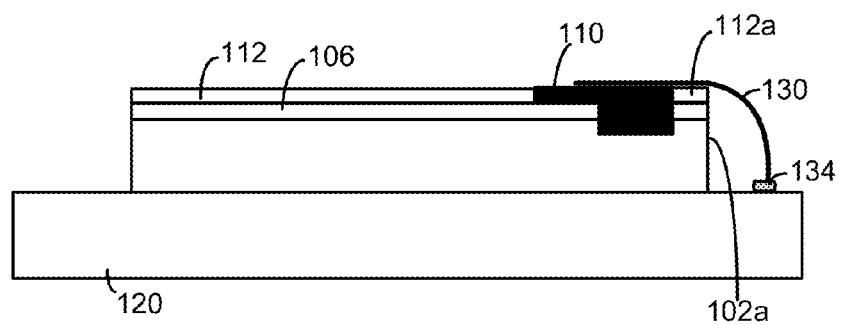
FIG. 17 is an edge view of a semiconductor device during fabrication including a die wire bonded to a substrate.
Figure 18:
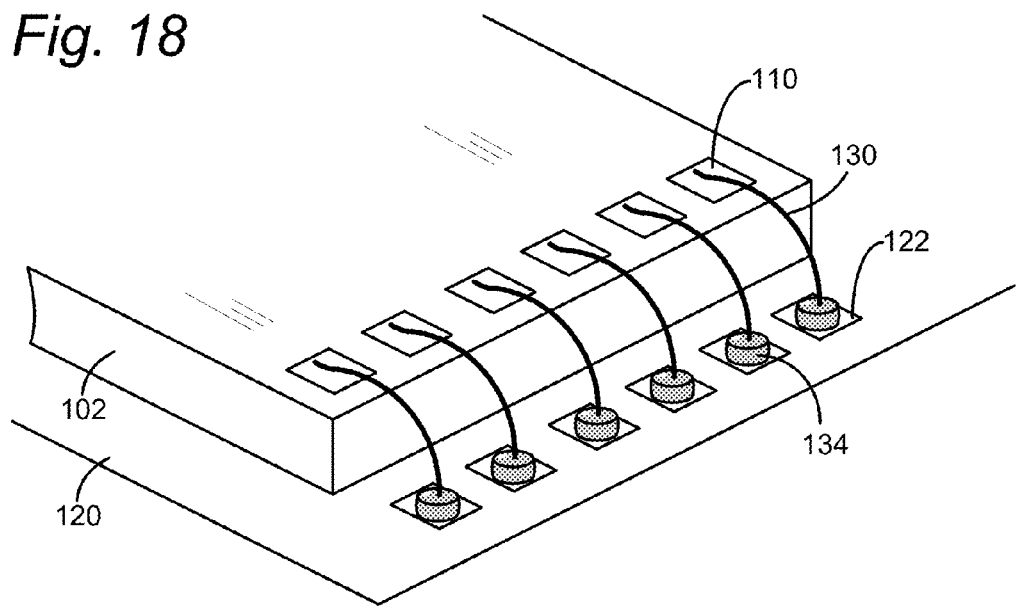
FIG. 18 is a perspective view of a semiconductor device during fabrication including a die wire bonded to a substrate.
Figure 19:
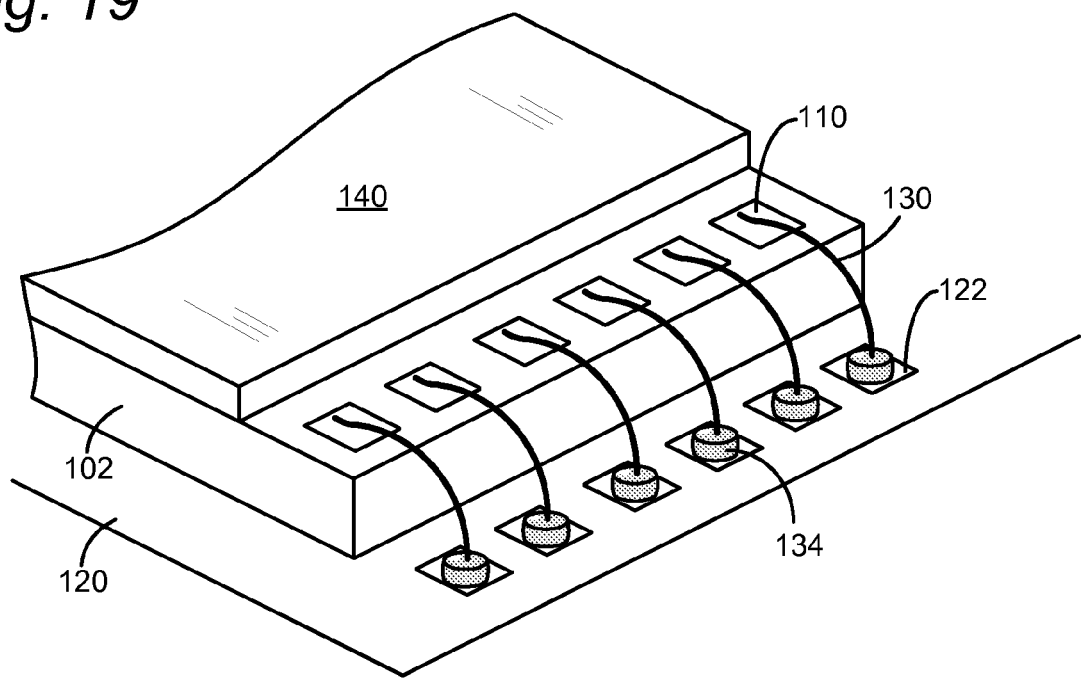
FIG. 19 is a perspective view of a semiconductor device during fabrication including a die wire bonded to a substrate and an intermediate layer mounted to the semiconductor die.

A process for forming a semiconductor package in accordance with the present invention using the semiconductor die 102 described above will now be explained with reference to the flowchart of FIG. 16, and the various views of FIGS. 17 through 21. Referring initially to the edge and perspective views of FIGS. 17 and 18, a first semiconductor die 102 may be mounted on a substrate 120 in a step 300. The die 102 may be mounted to substrate 120 via a die attach adhesive in a known adhesive or eutectic die bond process. Although not shown, substrate 120 may be part of a panel of substrates so that the semiconductor packages according to the present invention may be batch processed for economies of scale. Although fabrication of a single semiconductor package is described below, it is understood that the following description may apply to all packages formed on the substrate panel.

Although not critical to the present invention, substrate 120 may be a variety of different chip carrier mediums, including a PCB, a leadframe or a tape automated bonded (TAB) tape. Where substrate 120 is a PCB, the substrate may be formed of a core having top and/or bottom conductive layers formed thereon. The core may be various dielectric materials such as for example, polyimide laminates, epoxy resins including FR4 and FR5, bismaleimide triazine (BT), and the like.

The conductive layers may be formed of copper or copper alloys, plated copper or plated copper alloys, Alloy 42 (42FE/58NI), copper plated steel or other metals or materials known for use on substrates. The conductive layers may be etched into a conductance pattern as is known for communicating signals between the semiconductor die 102 and an external device (not shown). Substrate 120 may additionally include exposed metal portions forming contact pads 122 on an upper surface of the substrate 120. Where the semiconductor package is a land grid array (LGA) package, contact fingers (not shown) may also be defined on a lower surface of the substrate 120. The contact pads 122 and/or contact fingers may be plated with one or more gold layers, for example in an electroplating process as is known in the art.

After semiconductor die 102 is affixed to substrate 120 in step 300, bond wires 130 may be attached between redistribution pads 110 on die 102 and contact pads 122 on substrate 120 in a reverse ball bonding process in steps 302-304. In step 302, a wire bonding capillary device of known construction (not shown) may form and deposit a wire bond ball 134 on a contact pad 122. The ball 134 may be applied to the contact pad 122 under a load, while the transducer applies ultrasonic energy. The combined heat, pressure, and ultrasonic energy create a bond between the wire bond ball 134 and the contact pad 122. In step 304, the capillary pulls up and away from the ball 134 while paying out wire. The capillary then bonds the wire 130 to the corresponding redistribution pad 110 on die 102 using a low height wedge bond. The wire 130 may be applied to the redistribution pad 110 under a load, while the transducer applies ultrasonic energy. The combined heat, pressure, and ultrasonic energy create a bond between the wire 130 and the redistribution pad 110.

In accordance with the present invention, the wedge bond may be formed between the wire 130 and the redistribution pad 110 without having to use a second wire bond ball on the die bond pad as in conventional reverse ball bonding processes. In particular, given the large size of the redistribution pad 110, the pad 110 may receive the wedge bond in the reverse ball bond process without needing a wire bond ball formed thereon. Therefore, wire bond 130 may be provided at a lower height than is found in conventional semiconductor packages. Removing the ball found on the bond pads in a conventional reverse bonded semiconductor package allows the height of the wire bond on the semiconductor die to be reduced 30 μm to 50 μm. Moreover, referring specifically to FIG. 17, as the passivation layer 112 includes portion 112a on an upper surface of the semiconductor die 102 between the redistribution pad 110 and the front edge 102a of the die, the wire bond 130 may be pulled taut against the portion 112a of the passivation layer 112, thus effectively reducing the height of the wire bond to the thickness of the wire 130. The electrically insulating portion 112a prevents the wire bond 130 from electrically shorting against the surface of die 102.

In the embodiments shown in the figures, wire bonds 130 are provided along a single edge of die 102. In alternative embodiments of the present invention, wire bonds 130 as described above may be provided along one or more of two sides, three sides or all four sides of die 102.

In embodiments where multiple die are stacked in a completely overlapping relation, an intermediate layer 140 may be applied onto the exposed surface of die 102 in step 308. In the embodiment shown in FIGS. 19 and 20, the intermediate layer 140 may be a dielectric spacer that is applied over a portion of the upper surface of die 102 so as to leave the contact pads 122 and wire bonds affixed thereto exposed. The thickness of the intermediate layer need only be slightly greater than the height of the wire bond on die 102. In embodiments, the bond wire may have a thickness of approximately 25 μm, and the thickness of intermediate layer 140 may be for example 30 μm to 40 μm. It is understood that these dimensions are by way of example only, and may vary above or below the stated range in alternative embodiments. The spacer layer may be applied as a rigid material, or the spacer layer may be applied as a soft material and later cured to a rigid material.

Figure 20:
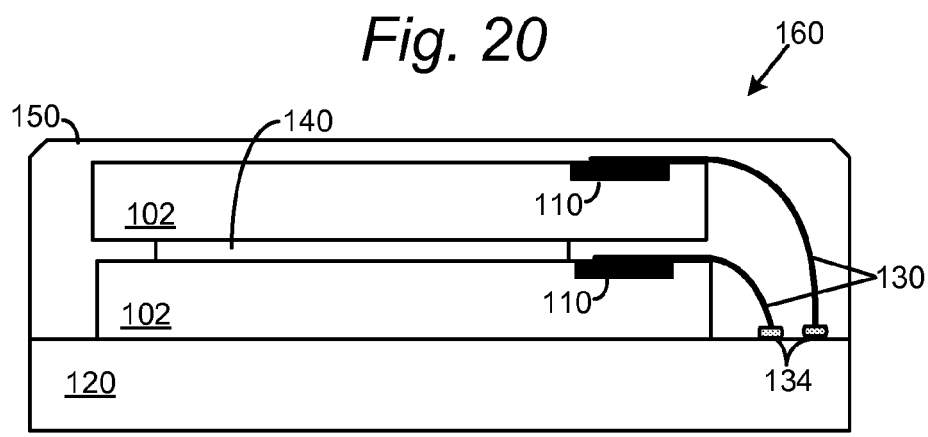
FIG. 20 is an edge view of a finished semiconductor device according to an embodiment of the present invention.

After the intermediate layer 140 is affixed to the die 102, a second die 102 may be affixed atop the intermediate layer 140 in step 310 and as shown in FIG. 20. In the embodiment shown, the second semiconductor die 102 may also include redistribution pads 110 and be wire bonded to the substrate 120 in step 310 using the same reverse ball bonding process as described above in steps 302 and 304. Thus, as shown in FIG. 20, both semiconductor die 102 in the die stack may include low height wire bonds that are pulled taut against the upper surface of the respective die. It is understood that only one of the semiconductor die 102 in the die stack may include redistribution pads 110 and ultra-low height reverse wire bonds, while the other die may include a conventional die affixed by a conventional wire bond process.

Embodiments of the present invention may include only the pair of semiconductor die 102. However, in further embodiments, more than two semiconductor die 102 may be stacked atop each other. In such embodiments, as indicated by the dashed arrow in FIG. 16, step 308 of applying an intermediate layer 140, step 310 of attaching an additional die and step 312 of wire bonding the additional die may be repeated for each additional semiconductor die stacked on the die stack. One or more of the semiconductor die in the completed die stack may include redistribution pads 110 and an ultra-low reverse wire bond.

In the above-described embodiments, the bond wires may be uncoated gold, though it may alternatively be copper, aluminum or other metals. In a further embodiment of the present invention, the bond wires may be pre-insulated with polymeric insulation that makes the surface of the wire electrically non-conductive. Such pre-insulated bond wire would allow the wire to be pulled tight against the upper surface of the die 102 without the need for passivation layer portion 112a at the edge of the die. Two examples of a pre-insulated bond wire which is suitable for use in the present invention are disclosed in U.S. Pat. No. 5,396,104, entitled, "Resin Coated Bonding Wire, Method Of Manufacturing The Same, And Semiconductor Device," and U.S. Published Patent Application No. 2004/0124545, entitled, "High Density Integrated Circuits And The Method Of Packaging the Same," both of which are incorporated by reference herein in their entirety. In further embodiments, both passivation layer portion 112a and pre-insulation on bond wires 130 may be omitted. In such embodiments, a small space may be provided between the wire bond and the upper surface of the die to which the wire bond is affixed so as to prevent electrical shorting of the wire bond against the semiconductor die.

As further shown in FIG. 20, after forming the die stack and electrically coupling the die stack to the substrate 120, the die stack may be encased within the molding compound 150 in step 316, and singulated from the panel in step 318, to form a finished semiconductor die package 160. Molding compound 150 may be a known epoxy such as for example available from Sumitomo Corp. and Nitto Denko Corp., both having headquarters in Japan. In some embodiments, the finished package 160 may optionally be enclosed within a lid in step 320.

In the embodiment shown in FIG. 20, the intermediate layer 140 is a dielectric spacer layer positioned between adjacent semiconductor die so as to leave the redistribution pads exposed. In an alternative embodiment shown in FIG. 21, the intermediate layer 140 may alternatively be an electrically insulative adhesive epoxy of known composition which may extend to the edge 102a of the semiconductor die 102 and cover the redistribution pads 110 and a portion of the wire bond 130. Such an embodiment is shown in FIG. 21. Further details relating to such an electrically insulative adhesive epoxy are disclosed in U.S. patent application Ser. No. 11/566,097, entitled "Method Of Fabricating A Film-On-Wire Bond Semiconductor Device," which application is incorporated by reference herein in its entirety. The intermediate layer 140 may be formed according to any of the embodiments disclosed in the above-referenced application.

In a further alternative embodiment including an offset die stack (not shown), the intermediate layer 140 may be omitted and the package may include a second die mounted directly to the first die. In such an embodiment, one or both of the die in the stack may include redistribution pads 110 and ultra-low reverse wire bonds as described above.

In embodiments, the semiconductor die 102 used within package 160 may include one or more flash memory chips, and possibly a controller such as an ASIC, so that the package 160 may be used as a flash memory device. It is understood that the package 160 may include semiconductor die configured to perform other functions in further embodiments of the present invention.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
a substrate including a plurality of contact pads;
a semiconductor die mounted to the substrate, the semiconductor die including:
a plurality of bond pads, and
a plurality of redistribution pads, covering the bond pads and enlarging a conductive area of the bond pads;
a passivation layer covering at least a portion of a surface of the semiconductor die including the plurality of redistribution pads; and
a wire bond having a first end coupled to a contact pad of the plurality of contact pads on the substrate, and a wedge bond at a second end spaced from the first end bonded directly to a redistribution pad of the plurality of redistribution pads, the wire bond being taut against an upper surface of the passivation layer.

2. A semiconductor device as recited in claim 1, further comprising an intermediate layer affixed to a side of the semiconductor die opposite the substrate.

3. A semiconductor device as recited in claim 2, wherein the intermediate layer comprises a rigid spacer layer.

4. A semiconductor device as recited in claim 2, wherein the intermediate layer comprises a cured adhesive epoxy.

5. A semiconductor device as recited in claim 2, wherein the semiconductor die comprises a first semiconductor die, the device further comprising a second semiconductor die affixed to the intermediate layer.

6. A semiconductor device as recited in claim 5, wherein the second semiconductor die includes a plurality of bond pads, and a plurality of redistribution pads, covering the bond pads and enlarging a conductive area of the bond pads.

7. A semiconductor device as recited in claim 6, further comprising a second wire bond having a first end coupled to a second contact pad of the plurality of contact pads on the substrate, and a second portion spaced from the first end and coupled directly to a redistribution pad of the plurality of redistribution pads on the second semiconductor die after the first end is coupled to the contact pad.

8. A semiconductor device as recited in claim 1, wherein the semiconductor die comprises a first semiconductor die, the device further comprising a second semiconductor die affixed to the first semiconductor die.

9. A semiconductor device as recited in claim 8, wherein the second semiconductor die includes a plurality of bond pads, and a plurality of redistribution pads, covering the bond pads and enlarging a conductive area of the bond pads.

10. A semiconductor device as recited in claim 9, further comprising a second wire bond having a first end coupled to a second contact pad of the plurality of contact pads on the substrate, and a second portion spaced from the first end and coupled directly to a redistribution pad of the plurality of redistribution pads on the second semiconductor die after the first end is coupled to the contact pad.

11. A semiconductor device, comprising:
a substrate including a plurality of contact pads;
a semiconductor die mounted to the substrate, the semiconductor die including:
a plurality of bond pads, and
a plurality of redistribution pads, electrically coupled to the bond pads and having a larger area than the bond pads;
a passivation layer covering at least a portion of a surface of the semiconductor die including the plurality of redistribution pads; and
a wire bond having a first end formed into a ball and coupled to a contact pad of the plurality of contact pads on the substrate, and a second portion spaced from the first end and wedge bonded directly to a redistribution pad of the plurality of redistribution pads, the second portion of the wire bond adjacent the wedge bond lying taut with the passivation layer.

12. A semiconductor device as recited in claim 11, wherein the plurality of redistribution pads have a length approximately equal to 200 µm to 250 µm.

13. A semiconductor device as recited in claim 11, wherein a redistribution pad of the plurality of redistribution pads is formed on top of a bond pad of the plurality of bond pads to which the redistribution pad is electrically coupled.

14. A semiconductor device as recited in claim 11, wherein a bond pad of the plurality of bond pads is spaced from a redistribution pad of the plurality of redistribution pads to which the bond pad is electrically coupled.

15. A semiconductor device as recited in claim 11, further comprising an intermediate layer affixed to a side of the semiconductor die opposite the substrate.

16. A semiconductor device as recited in claim 15, wherein the intermediate layer has a thickness of between 30 μm and 40 μm.

17. A semiconductor device as recited in claim 15, wherein the intermediate layer comprises a rigid spacer layer.

18. A semiconductor device as recited in claim 15, wherein the intermediate layer comprises a cured adhesive epoxy.

* * * * *